United States Patent [19]

Hamlin

[11] 4,198,153
[45] Apr. 15, 1980

[54] PROCESSOR FOR PRINTING PLATES

[75] Inventor: James S. Hamlin, Cherry Hill, N.J.

[73] Assignee: E. I. Du Pont de Nemours and Company, Wilmington, Del.

[21] Appl. No.: 4,489

[22] Filed: Jan. 18, 1979

[51] Int. Cl.² ............................................. G03D 3/06
[52] U.S. Cl. ........................... 354/325; 354/327;
354/336; 141/271; 141/377; 134/117; 134/186
[58] Field of Search ............... 354/307, 312, 315, 323,
354/324, 325, 326, 327, 328, 331, 336, 330;
141/45, 271, 377, 239; 222/163, 164, 165, 166,
344, 353, 527; 134/56 R, 117, 156, 186

[56] References Cited

U.S. PATENT DOCUMENTS

| 1,825,126 | 9/1931 | Powers | 354/336 |
| 3,173,577 | 3/1965 | Robbins et al. | 222/165 |
| 3,641,912 | 2/1972 | Mills | 354/331 |
| 3,825,943 | 7/1974 | Masygan | 354/331 |
| 3,840,214 | 10/1974 | Merz | 354/330 |
| 3,884,149 | 5/1975 | Shores | 354/327 |
| 4,134,665 | 1/1979 | Wada et al. | 354/323 |

FOREIGN PATENT DOCUMENTS 10334 of 1884 United Kingdom ................. 354/327

Primary Examiner—L. T. Hix
Assistant Examiner—Alan Mathews

[57] ABSTRACT

A semiautomatic apparatus for processing the imaged surface of a printing plate. The apparatus includes an enclosed tray in which a plate is processed and a storage tank for processing liquid. In a processing cycle, the tank and tray are moved in timed sequence to transfer the liquid from the tank to the tray and back and to drain subsequently introduced wash water from the tray.

5 Claims, 6 Drawing Figures

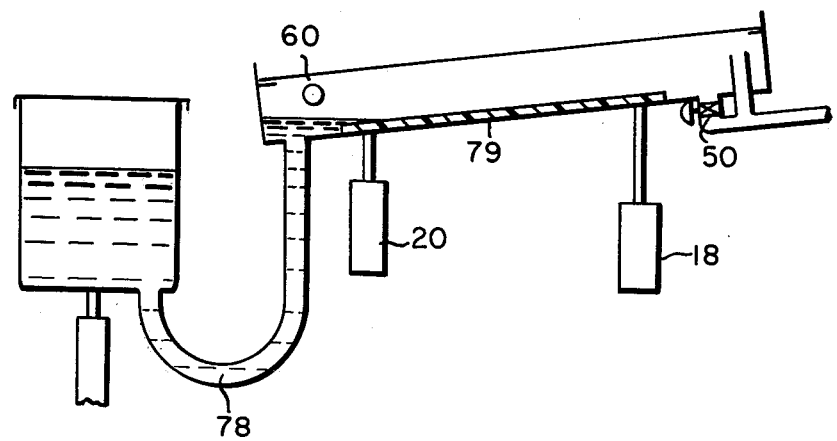
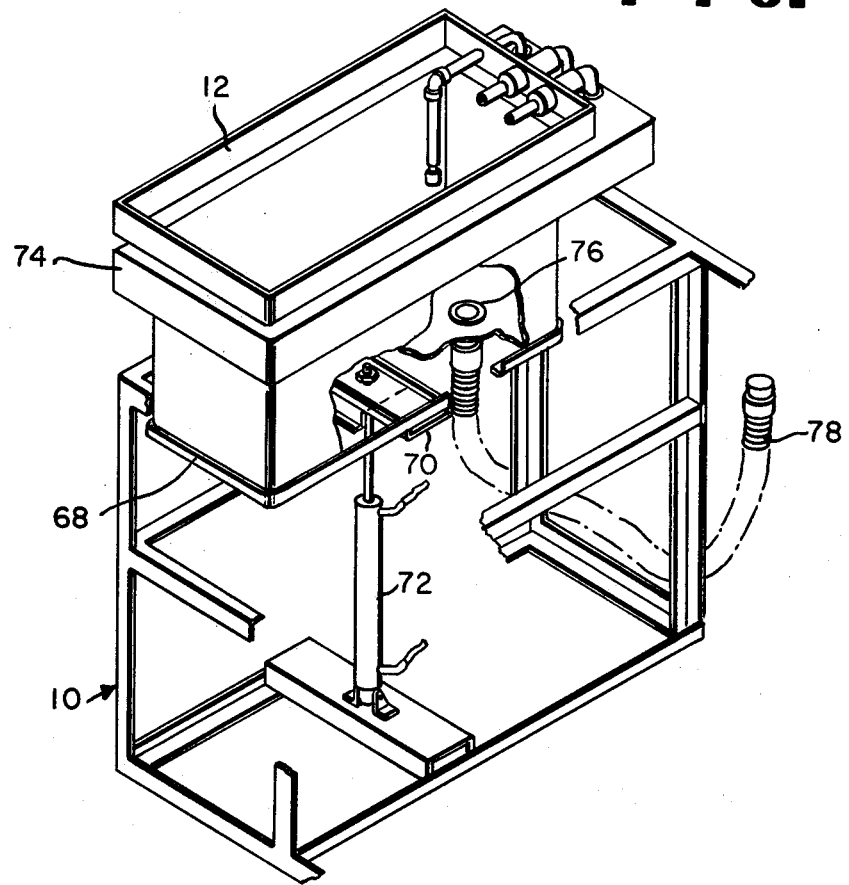

PROCESSOR FOR PRINTING PLATES

TECHNICAL FIELD

This invention relates generally to the preparation of printing plates and, more particularly, to the post development treatment of the imaged surface of a photohardenable printing plate.

BACKGROUND

It is known in the printing industry that a printing plate having a photohardenable surface layer can be exposed through an image bearing transparency to generate imagewise hardened regions. The exposed plate is then developed in an appropriate solvent to remove unexposed polymer through the action of the solvent alone or in conjunction with a mechanical scrubbing action. Depending on the particular photohardenable element, its chemical composition and the method of development, it is sometimes necessary to reduce tack on the surface of the element in a finishing treatment.

Available finishing equipment includes a large tray that holds the solution in which a developed plate is immersed by an operator and from which the plate must be removed on time. Then, the plate is rinsed with tap water and dried. As a practical matter, this equipment requires continuous attendance by an operator. Although exhaust ducting is provided, there is always a possibility of exposure to objectionable fumes when a cover for the tray is raised and a plate is being immersed.

DISCLOSURE OF INVENTION

With the apparatus disclosed and claimed herein, the need for continuous attendance by an operator is eliminated and the possibility of exposure to fumes has been reduced substantially. The apparatus includes a tray with an upstanding rim, a lid for the tray and a storage tank for processing solution. A hose interconnects the tank and tray. When a developed plate has been placed in the tray and enclosed by the lid, the tank is raised to a position above the tray and the solution flows in. After a set processing time, the tank is automatically lowered and the tray is tilted to insure that all of the solution flows back to the tank. Then, the tray is tilted in the opposite direction and the plate is washed with water from a spray bar.

DESCRIPTION OF DRAWINGS

The best mode known by the applicant for carrying out the invention is illustrated in the accompanying drawings wherein:

FIG. 3 is a fragmentary perspective of the support frame and tank shown in FIG. 1, parts having been broken away to reveal details of construction;

FIGS. 4 and 5 are schematic views showing relative movements of the tank and tray as the latter is filled and then emptied.

DESCRIPTION OF APPARATUS

Figure 1:
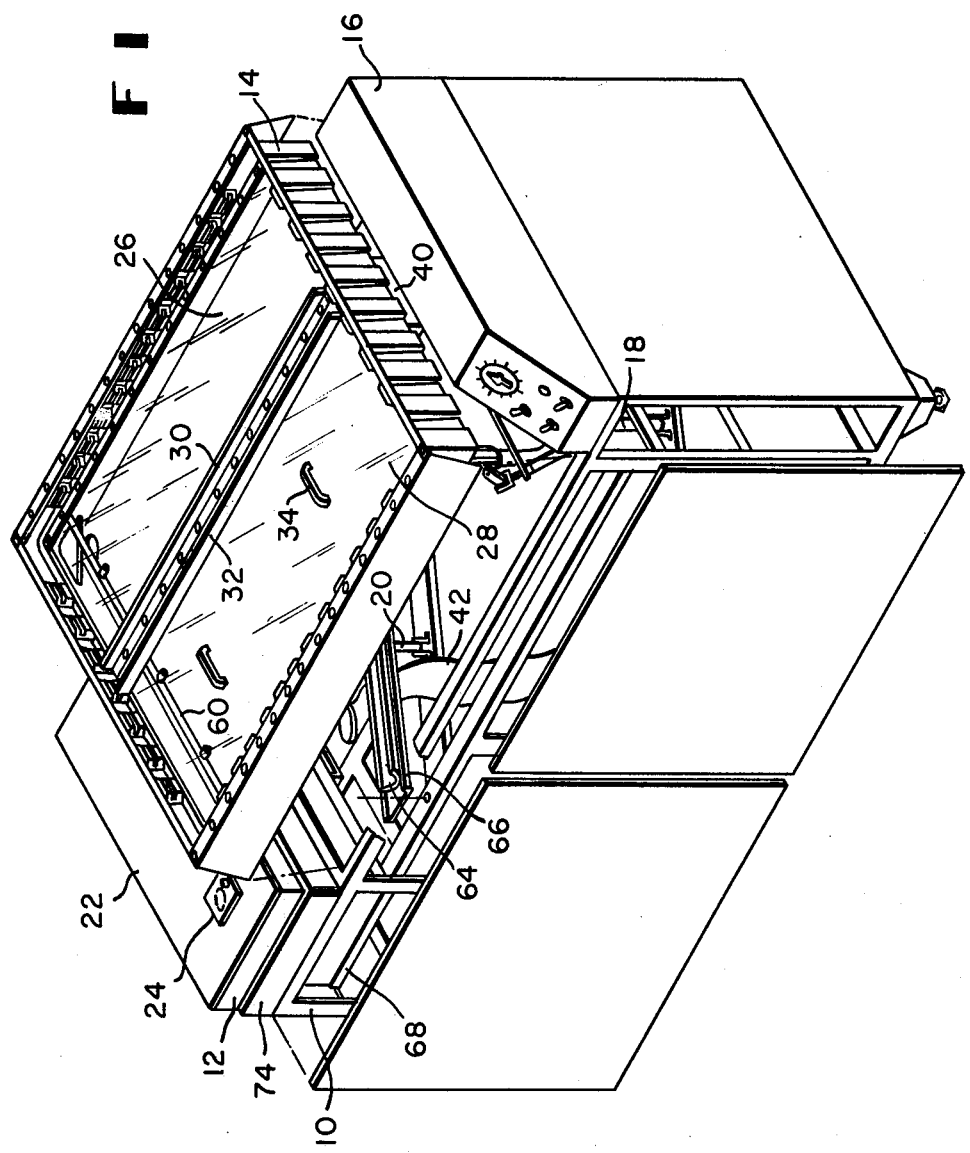
FIG. 1 is an exploded perspective of the apparatus.

As shown in FIG. 1, the apparatus has a frame 10 that provides supports for a storage tank 12, a processing tray 14, a control box 16 and various actuators such as a pair of piston-cylinder assemblies 18, 20 that tilt the tray at different stages of a plate-finishing process.

Tank 12 has a lid 22 with an opening for the introduction of processing ingredients and a pivoted cover 24 for the opening. Tray 14 has a lid that includes a mounted back section 26 and a front section 28. Section 28 is swingably attached to section 26 by a flexible strap beneath angle bars 30, 32 and has handles 34 that facilitate easy access to the tray.

Figure 2:
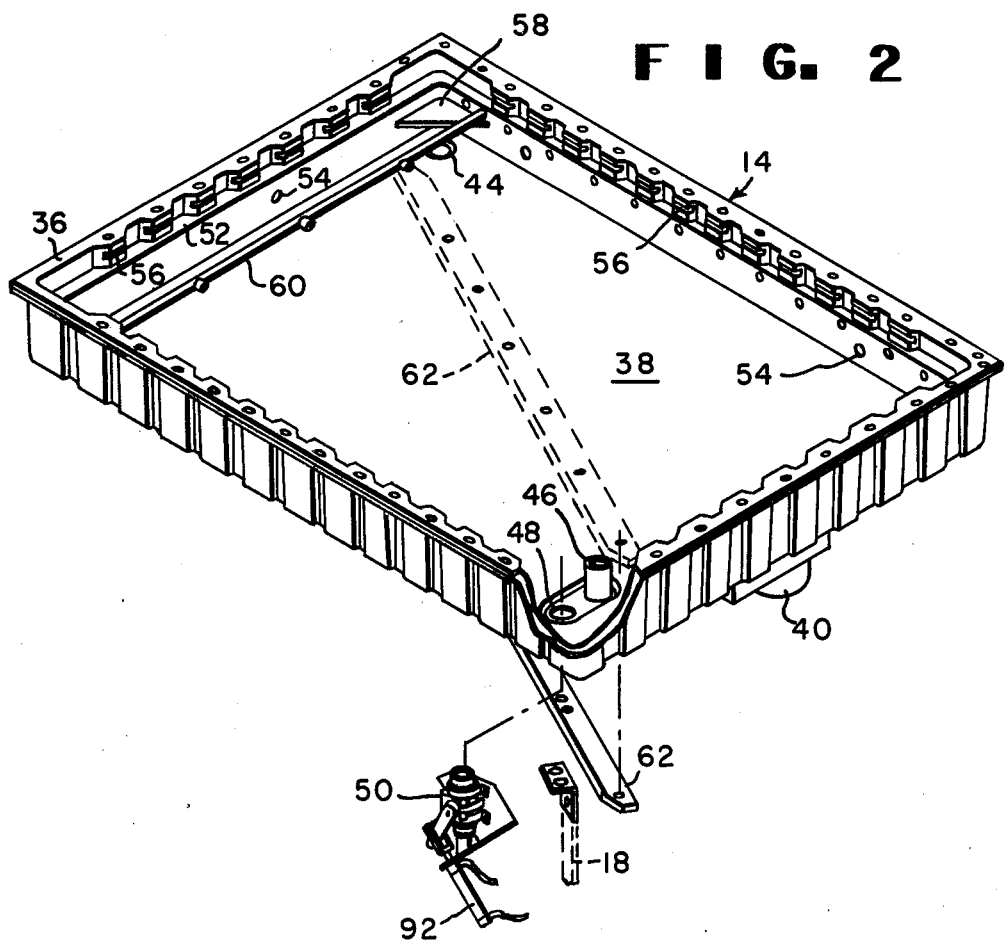
FIG. 2 is an exploded perspective of the tray shown in FIG. 1.

Referring now to FIGS. 1 and 2, tray 14 is rectangular and has an upstanding rim 36 on a bottom 38. Rim 36 and bottom 38 are of double-walled construction. At each end, there is a connection 40 for an exhaust hose 42. In one corner, bottom 38 has an opening 44 that communicates with storage tank 12. In a diagonally opposed corner, there are two drain openings, one of which is fitted with a stand pipe 46. The other opening has been designated 48 and is fitted with a valve 50.

Along its inner wall, rim 36 has a ledge 52 against which lid sections 26, 28 are fitted. Below ledge 52, there are exhaust openings 54 and, above the ledge, there are bulges with exhaust openings 56. Openings 54, 56 communicate with exhaust hoses 42 through the void between the walls of rim 36 and bottom 38. Openings along the top of rim 36 receive fasteners for skirts that surround the tray when it is in place on frame 10.

Above opening 44, there is a splash plate 58 and, above the splash plate, a spray bar 60 is fitted between two sides of rim 36. A reinforcement bar 62 is attached to and extends diagonally of the outer wall of bottom 38. The rods of assemblies 18, 20 are bracketed to bar 62. A semicircular rib 64 (FIG. 1) is integrally joined to the outer wall of bottom 38 and is obliquely disposed with respect to bar 62 and the sides of rim 36. When tray 14 is in place on frame 10, rib 64 rests on a support bar 66 that is attached to other frame parts. Thus, when one of the assemblies 18, 20 is extended, tray 14 tilts about an axis coincident with the line of contact between rib 64 and support bar 66. Depending on which assembly is extended, one of the openings 44, 48 is lowered to a drain position.

Referring now to FIGS. 1 and 3, tank 12 rests on a support 68 that includes a crosspiece 70. The rod of a piston-cylinder assembly 72 is attached to crosspiece 70 and functions as a support for tank 12. When assembly 72 is extended, support 68 and tank 12 move upwardly with respect to collar 74. In its bottom wall, tank 12 has an opening 76 that is in communication with the opening 44 in tray 14 through a flexible, unobstructed, pressure equalizing hose 78. Two conduits extending through one wall of the tank 12 are connected to flexible hoses that pass through holes in collar 74 and are, in turn, connected to tap water and the exhaust system. A third conduit carries wiring for a float that determines when the flow of water to the tank should be cut off, e.g., during replenishment of the solution.

Figure 6:
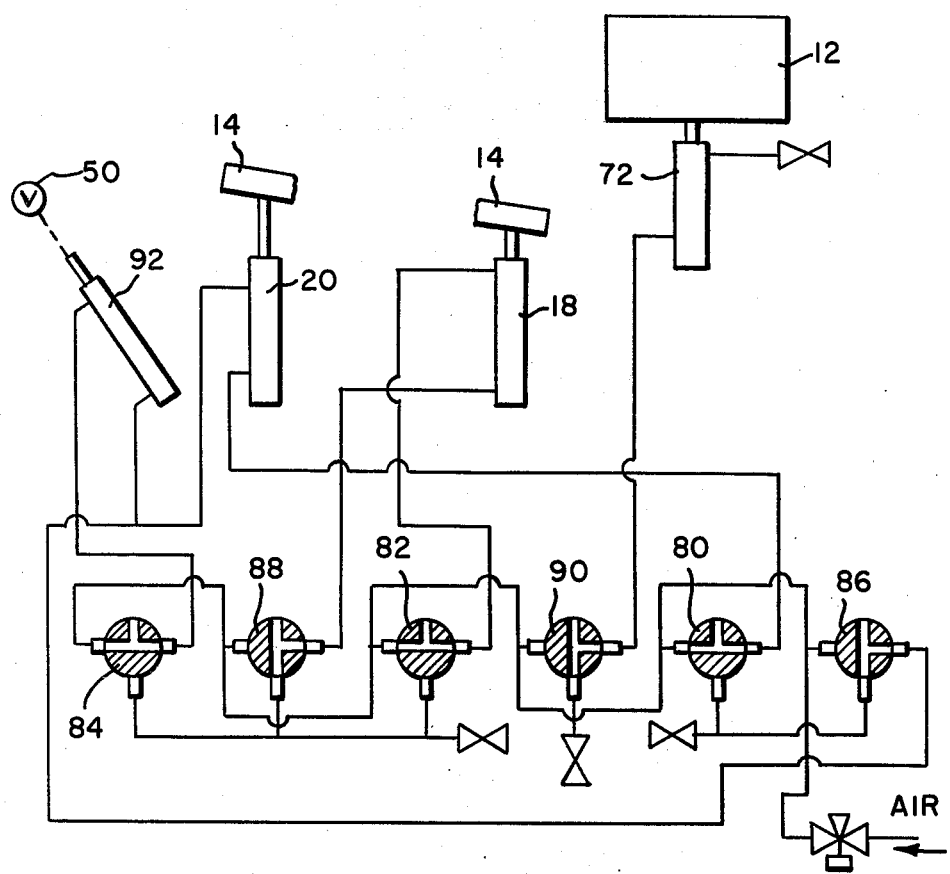
FIG. 6 is a diagram of the pneumatic system for actuating various elements of the apparatus.

In operation, the first step is to either prepare a solution in tank 12 or to replenish the solution. At this time, tank 12 is in its lowest position and tray 14 is tilted to the right (FIG. 6). After air, water and power have been turned on, an exposed and developed printing plate 79 is placed in tray 14, relief image up, and all sides of the plate are weighted with shot bottles. Lid section 28 is closed and a time selector on control box 16 is turned to the desired processing time. The various valves are in the positions shown in FIG. 6, i.e., valves 80, 82, 84 are energized and valves 86, 88, 90 and deenergized.

Figure 4:
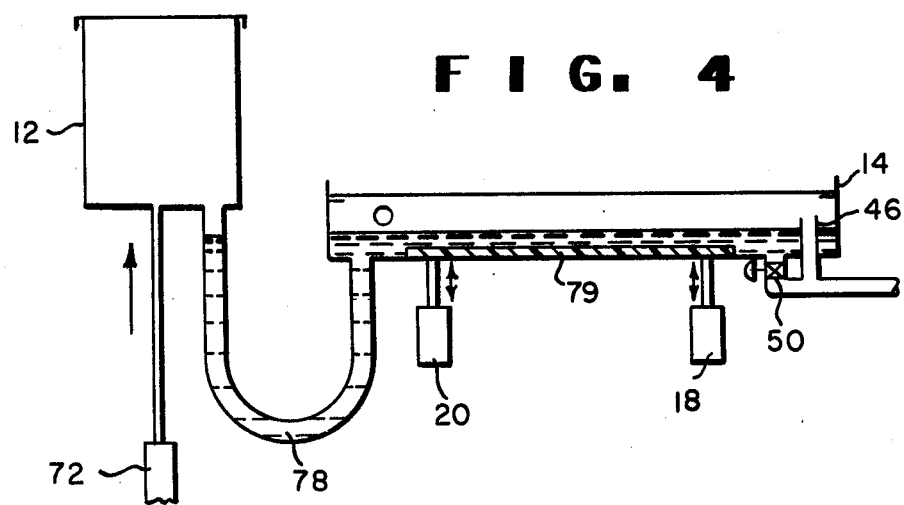

When the power switch on box 16 is turned on, microswitches in the control circuitry deenergize valves 80, 84 and energize valves 86, 90. This repositioning of the valves retracts assembly 20 and extends assemblies 72, 92. The latter movements level tray 14, close valve 50 and elevate tank 12 (FIG. 4). Solution flows through hose 78 to tray 14 where it floods over a printing plate 79. Toward the end of the set processing period, valve 90 is deenergized to lower tank 12. Then, valve 88 is energized and valve 82 is deenergized to extend assembly 18. Upon extension of assembly 18, tray 14 is tilted obliquely and one end is elevated to the position shown in FIG. 5. The solution flows back to tank 12. Next, valve 82 is energized and valve 88 is deenergized to level the tray. As soon as assembly 18 has retracted and the tray is level, valve 80 is energized and valve 86 is deenergized. This extends assembly 20 and tilts the tray 14 to the right. A valve (not shown) is opened to connect spray bar 60 to the water supply and valve 84 is energized to retract assembly 92 and open drain valve 50. At the end of the cycle, a buzzer sounds to alert the operator. When it is convenient, he can remove and dry the plate. The various valves and piston-cylinder assemblies are left in the positions shown in FIG. 6.

The apparatus disclosed herein is particularly useful in the finishing of flexographic printing plates having photohardenable layers, for example, the CYREL ® photopolymer flexographic printing plates marketed by the assignee hereof. Following exposure, the image is developed by removing unpolymerized material in unexposed regions on the surface of a plate. Then, the plate is finished to reduce the level of tack on its imaged surface. The solution used in this finishing process is prepared from concentrated hydrochloric acid, a commercial bleach and water. Heretofore, it has been necessary to prepare such solutions in an uncovered finishing tray. Now, the solution can be prepared or replenished in tank 12 simply by moving cover 24 away from the opening in lid 22 and pouring in water, acid and bleach. Then, the tank is filled with more water. As these steps are carried out, lid 22 is in place and the exhaust system is in operation. After a developed plate has been placed in tray 14 and lid section 28 has been closed, tank 12 is elevated and the solution flows to the tray in a minimum of time and with a minimum of turbulence. There is no need for pumping the solution and thereby generating turbulence, heat and fumes. Thus, the possibility of exposure to objectionable fumes has been reduced to what is believed to be a practical minimum.

Finishing solutions of the type mentioned above attack most metals. In such usages, the tank, tray and other parts exposed to the solution should accordingly be fabricated from plastics or enamelware or lined with glass. Thus far, the tray has been molded from an acrylonitrile-butadiene-styrene (ABS) polymer and the tank from polypropylene. Lids have been made from sheets of a clear, acrylic plastic. Polyvinyl chloride, polyethylene and similar polymers could also be used.

Although developed for use in the finishing of photohardenable printing plates, the apparatus of the present invention is, of course, useful in other applications requiring the rapid immersion of a large imaged element into a chemical solution with minimal exposure of the operator to chemical fumes.

The device is particularly adapted to uses in which pumping of the chemical solutions is impractical, either due to the nature of the chemicals or due to the cost of the pumping equipment. It is further well adapted for uses where observation of the treated surface is desirable during treatment. It is therefore useful in the development and fixing of large silver halide bearing elements and can be adapted for the provision of more than one chemical treatment through the addition of more chemical supply tanks and discharge paths.

What is claimed as new and desired to be secured by Letters Patent is:

1. An apparatus for processing the imaged surface of a photosensitive sheet, said apparatus comprising:
   a tray mounted for tilting movement, said tray having an upstanding rim;
   a lid for the tray;
   a storage tank for processing liquid;
   a hose presenting an open passage connecting the tank to the tray adjacent one end of the tray;
   a spray bar adjacent said one end, there being a drain means at the other end of the tray;
   means mounting the tank for movement between positions where the normal level of solution in the tank is respectively below and above the tray; and
   extensible means connected to the tray for tilting its other end upwardly when the tank is moved to its position below the tray and for tilting said one end upwardly before a sheet is sprayed.

2. The apparatus of claim 1 wherein said tray is rectangular and mounted for tilting movement about an oblique, transverse axis and wherein said hose connection and said drain means are located in diagonally opposed corners.

3. The apparatus of claim 2 wherein said rim has spaced inner and outer walls and said inner walls have exhaust openings and wherein is provided an exhaust connection to the space between said walls.

4. The apparatus of claim 3 wherein the inner walls have exhaust openings above and below said lid.

5. The apparatus of claim 4 wherein the photosensitive sheet includes a photohardenable layer.

* * * * *